United States Patent
Ma et al.

(10) Patent No.: US 9,780,730 B2
(45) Date of Patent: Oct. 3, 2017

(54) WIDEBAND SELF-ENVELOPE TRACKING RF POWER AMPLIFIER

(71) Applicant: Mitsubishi Electric Research Laboratories, Inc., Cambridge, MA (US)

(72) Inventors: Rui Ma, Somerville, MA (US); SungWon Chung, Brookline, MA (US); Koon Hoo Teo, Lexington, MA (US)

(73) Assignee: Mitsubishi Electric Research Laboratories, inc., Cambridge, MA (US)

( * ) Notice: Subject to any disclaimer, the term of this patent is extended or adjusted under 35 U.S.C. 154(b) by 0 days.

(21) Appl. No.: 14/490,864

(22) Filed: Sep. 19, 2014

(65) Prior Publication Data

US 2016/0087585 A1   Mar. 24, 2016

(51) Int. Cl.
*H03G 3/20*   (2006.01)
*H03F 1/02*   (2006.01)
(Continued)

(52) U.S. Cl.
CPC ......... *H03F 1/0205* (2013.01); *H03F 1/0211* (2013.01); *H03F 1/42* (2013.01);
(Continued)

(58) Field of Classification Search
CPC ..................................................... H03F 3/191
(Continued)

(56) References Cited

U.S. PATENT DOCUMENTS 4,717,884 A   1/1988   Mitzlaff 6,043,707 A   3/2000   Budnik
(Continued)

FOREIGN PATENT DOCUMENTS

EP   136584 A1   10/2003
JP   2011109233   6/2011
(Continued)

OTHER PUBLICATIONS

Kheirkhani et al. "Improved Envelope Injection and Termination (EIT) RF Power Amplifier With Envelope Equalization for Mobile Terminal Applications," IEEE Transactions on Microwave Theory and Techniques, vol. 62, No. 2, Feb. 2014
(Continued)

*Primary Examiner* — Khanh V Nguyen
*Assistant Examiner* — Khiem Nguyen
(74) *Attorney, Agent, or Firm* — Gene Vinokur; James McAleenan; Hironori Tsukamoto

(57) ABSTRACT

A wideband self-envelope tracking power amplifier (PA) can use more than a 40-MHz channel bandwidth and improves the envelope bandwidth limit of a self-envelope tracking PAs by ten times. The PA uses an envelope load network, which is based on a general multi-stage low-pass filter. The envelope load network located between an RF choke inductor and main DC power supply provides a dynamically modulated PA supply voltage without using a dedicated envelope amplifier. An input terminal of the network connects a main PA via an RF choke inductor to an input of low-pass filter. An output terminal is connected to the low-pass filter via an envelope choke inductor and to a direct current (DC) power supply. A DC blocker is connected between the output of the low-pass filter and ground by a termination resistor.

6 Claims, 9 Drawing Sheets

(51) Int. Cl.
*H03F 1/56* (2006.01)
*H03F 3/19* (2006.01)
*H03F 3/21* (2006.01)
*H03F 1/42* (2006.01)
*H03F 3/189* (2006.01)

(52) U.S. Cl.
CPC ............ *H03F 1/565* (2013.01); *H03F 3/189* (2013.01); *H03F 3/19* (2013.01); *H03F 3/21* (2013.01); *H03F 2200/102* (2013.01); *H03F 2200/36* (2013.01); *H03F 2200/451* (2013.01)

(58) Field of Classification Search
USPC .................................. 330/302, 306, 136, 297
See application file for complete search history.

(56) References Cited

U.S. PATENT DOCUMENTS

| | | | |
|---|---|---|---|
| 6,349,216 B1 | 2/2002 | Alberth, Jr. | |
| 7,215,221 B1 | 5/2007 | Ellis et al. | |
| 7,602,240 B2 * | 10/2009 | Gao | H03F 1/565 330/302 |
| 8,600,321 B2 | 12/2013 | Nambu et al. | |
| 8,626,091 B2 | 1/2014 | Khlat et al. | |
| 8,737,940 B1 | 5/2014 | Langer et al. | |
| 2004/0000951 A1 | 1/2004 | Stengel et al. | |
| 2006/0176117 A1 * | 8/2006 | Kawashima | H03F 3/189 330/302 |
| 2008/0180178 A1 | 7/2008 | Gao et al. | |
| 2013/0069726 A1 * | 3/2013 | Mochizuki | H03F 1/565 330/286 |
| 2013/0200865 A1 | 8/2013 | Wimpenny | |
| 2013/0217345 A1 | 8/2013 | Balteanu et al. | |

FOREIGN PATENT DOCUMENTS

| | | |
|---|---|---|
| TW | 201415790 A | 6/2012 |
| WO | 2009147379 A1 | 10/2009 |
| WO | 2009147379 A1 | 12/2009 |

OTHER PUBLICATIONS

Kheirkhahi et al. "Enhanced Class A/AB Mobile Terminal Power Amplifier efficiency by input envelope injection and self envelope tracking," Microwave symposium digest, MTT, 2011 IEEE MTT-S International, IEEE, Jun. 5, 2011, pp. 1-4.

Kheirkhahi et al. "RF Power Amplifier Efficiency Enhancement by Envelope Injection and Termination for Mobile Terminal Applications," IEEE Transactions on Microwave Theory and Techniques, IEEE Service Center, Piscatawa, NJm US, vol. 61, No. 2, pp. 878-889, Feb. 1, 2013.

* cited by examiner

WIDEBAND SELF-ENVELOPE TRACKING RF POWER AMPLIFIER

FIELD OF THE INVENTION

This invention relates generally to very wideband RF power amplifiers (PAs), and more particularly to using the PAs for wideband and multi-band operation of wireless communication.

BACKGROUND OF THE INVENTION

The need for very wide signal bandwidth (~10-100 MHz) radio frequency (RF) power amplifiers has significantly increased due to the emerging wireless communication technologies. A cost-effective solution is a single power amplifier, which can support existing communication technologies, such as Wideband Code Division Multiple Access (WCDMA), and Global System for Mobile Communications (GSM), and Enhanced Data rates for GSM Evolution (EDGE) in one frequency band as well as new Long-Term Evolution (LTE) technologies in other frequency bands. However, there are many design challenges for a low-cost implementation of a high-performance very wideband RF power amplifier.

Average power efficiency is of particular importance in wireless communication technologies that transmit a very high peak-to-average power ratio (PAPR) signal. In conventional linear PAs, the average power efficiency for a high PAPR signal is significantly lower than peak power efficiency because the power efficiency is basically proportional to the output power. For example, if the peak power efficiency is 60% at the peak output power, the power efficiency at 6-dB output power back-off is only 30% with an ideal Class-A PA, exhibiting more than 50% loss. The active element remains conducting all of the time. For concurrent dual-band LTE signals with 40-MHz aggregated bandwidth, which have higher than 10-dB PAPR, the average efficiency of an ideal Class-A PA is only approximately 6%.

FIG. 1 shows a prior art envelope tracking PA, which significantly improves the average power efficiency for high PAPR signals, see e.g., U.S. Pat. No. 8,737,940, U.S. Pat. No. 8,626,091, U.S. Pat. No. 8,600,321, and JP 2011109233. The envelope tracking power amplifier systems typically include a direct current (DC) bias network composed of 101 (DC block capacitor) and a RF choke 102, an RF choke inductor 103, a main RF PA 120, and envelope amplifier 110.

An envelope signal amplitude 106 (0-2$V_{PA}$) is extracted from a digital baseband of the RF signal 104 or directly from an analog RF signal, while an input signal 105 is fed to the envelope amplifier 110 to modulate the PA supply voltage 107. Because the envelope amplifier 110 dynamically modulates the PA supply voltage, the PA 120 always provides maximum output power at a given supply voltage. Therefore, the average power efficiency of an ideal envelope tracking power amplifier is theoretically the same as the peak efficiency of the main power amplifier, which is the key advantage.

However, envelope tracking power amplifier systems have extremely challenging design requirements for the envelope amplifiers that must operate with high power efficiency and wide bandwidth. Compared to conventional linear PAs, the disadvantage of the envelope tracking PAs is the limited bandwidth and efficiency that arises from the envelope amplifiers. Although there are efforts to improve the design trade-off of the envelope amplifiers between output power and bandwidth, e.g., see U.S. 20130217345, U.S. 20130200865, and U.S. Pat. No. 6,043,707, it is very challenging to transmit RF signals with a channel bandwidth higher than 20 MHz with the envelope tracking PAs. Another disadvantage of the envelope tracking PAs is the increased implementation cost and form factor due to the complexity of the envelope amplifier 110.

FIG. 2 shows a prior art self-envelope tracking PA, which removes the envelope amplifier by using an input network 200 and self-envelope load network 210. Therefore, the self-envelope tracking PA shown in FIG. 2 can achieve a significant reduction in both cost and size compared to the envelope tracking PA shown in FIG. 1.

The operation of the self-envelope tracking PA is as follows. An RF input signal 205 is applied through a DC blocker 201. The envelope amplitude of the RF input signal is inverted 206, and then applied through another DC blocker 203. The RF input signal 205 is prevented from passing towards the DC supply by using an inductor 202, which provides high impedance at the RF frequency. The gate bias of the main PA 220 is established by a resistor 204, which isolates the DC gate bias from both the RF input signal 205 and the envelope signal 206. The envelope signal 206 modulates the PA supply voltage 213 at the node between the RF choke inductor 221 and the inductor 212 of the self-envelope load network 210. The resonant frequency of the LC tank, which is formed by the capacitor 211 and the inductor 212, is tuned to the frequency where the CDF (cumulative distribution function) of the signal is approximately 50%. Another advantage of the self-envelope tracking PA is that a low supply voltage can be used; the PA output signal 222 can be obtained by using a supply voltage Vdd, which is lower than the supply voltage $V_{pa}$ of the conventional envelope tracking PAs, further improve the system power efficiency.

FIG. 3 shows one disadvantages of the prior art self-envelope tracking PAs. Because the self-envelope load network 210 has a resonant frequency $f_0$, the power efficiency of the self-envelope tracking PAs 300 is highest at the resonant frequency $f_0$. Therefore, the bandwidth of the self-envelope tracking PAs is limited. Beyond the cross-over frequency $f_c$, the power efficiency of the self-envelope tracking PAs 300 becomes even lower than the power efficiency of the fixed voltage supplied PA. With the conventional self-envelope load network 210, the cross-over frequency $f_c$ is typically below 10 MHz.

SUMMARY OF THE INVENTION

The embodiments of the invention provide a wideband self-envelope tracking power amplifier (PA), which overcomes the problem of limited bandwidth with the conventional self-envelope tracking PAs. The conventional self-envelope tracking PAs does not need a dedicated envelope amplifier but provides a comparable average efficiency, RF signals with no more than 10-MHz channel bandwidth. Considering that the modern communication signals such as LTE-Advanced can exploit more than 40-MHz channel bandwidth, the bandwidth of the self-envelope tracking PAs is a critical limitation. The invention improves the conventional envelope bandwidth limit of the self-envelope tracking PAs by ten times or further such that advanced modern communication signals can be transmitted by self-envelope tracking PAs with increased power efficiency.

A key enabling element of this invention is a novel envelope load network, which is based on a general multi-stage low-pass filter. The envelope load network is located between an RF choke inductor and main DC power supply, which provides a dynamically modulated PA supply voltage without using a dedicated envelope amplifier.

The conventional self-envelope tracking PAs uses a resonant tank based envelope load network. Compared to the resonant tank envelope load, the multi-stage low-pass filter based envelope load network of this invention provides a much larger bandwidth for the baseband envelope signals. The main challenge in using a low pass filter in the envelope load network is that one end-point of the filter cannot be terminated with a finite impedance with a reasonable magnitude DC supply, which interfaces with the envelope load network, and presents very low impedance to the low pass filter. When either end of a low-pass filter is close to short, the pass band of the low-pass filter is significantly distorted, so that a wide envelope bandwidth cannot be achieved.

As a first advantage, the invention solves this design challenge by using AC-termination, which uses a filter termination impedance to provide wideband low-pass frequency response, while avoiding any DC power consumption.

The second advantage of the self-envelope tracking PA is that a low supply voltage can be used, which is an important advantage in battery operated mobile devices. In order to produce the same output power, the necessary supply voltage of the self-envelope tracking PAs in the invention is typically 20-30% lower than both the conventional linear PAs and envelope tracking PAs.

The third advantage of the wideband self-envelope tracking PA is that a higher output power can be provided, which is also a very important advantage in battery operated mobile devices. When transmitting high PAPR signals, the average output power level is significantly lower than the peak output power. Therefore, achieving a necessary average output power with high PAPR signals in a mobile device is a challenging task because the battery voltage slowly decreases over time. Compared to the conventional linear PAs and envelope tracking PAs with the same supply voltage, the self-envelope tracking PAs of this invention can typically provide 1-2 dB higher output power.

DETAILED DESCRIPTION OF THE PREFERRED EMBODIMENTS

Figure 1:
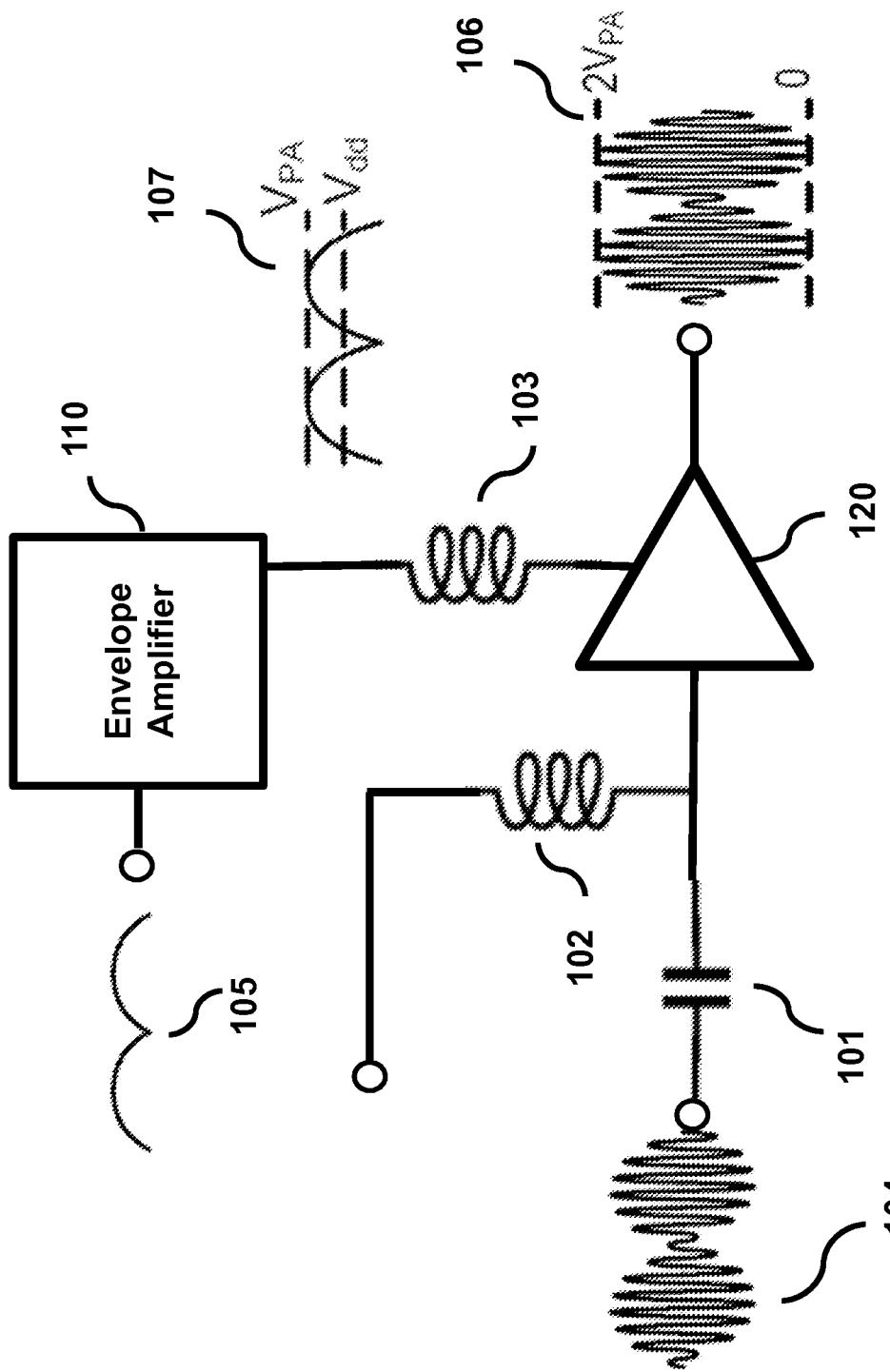
FIG. 1 is a schematic of a prior art envelope tracking power amplifier (PA)
Figure 2:
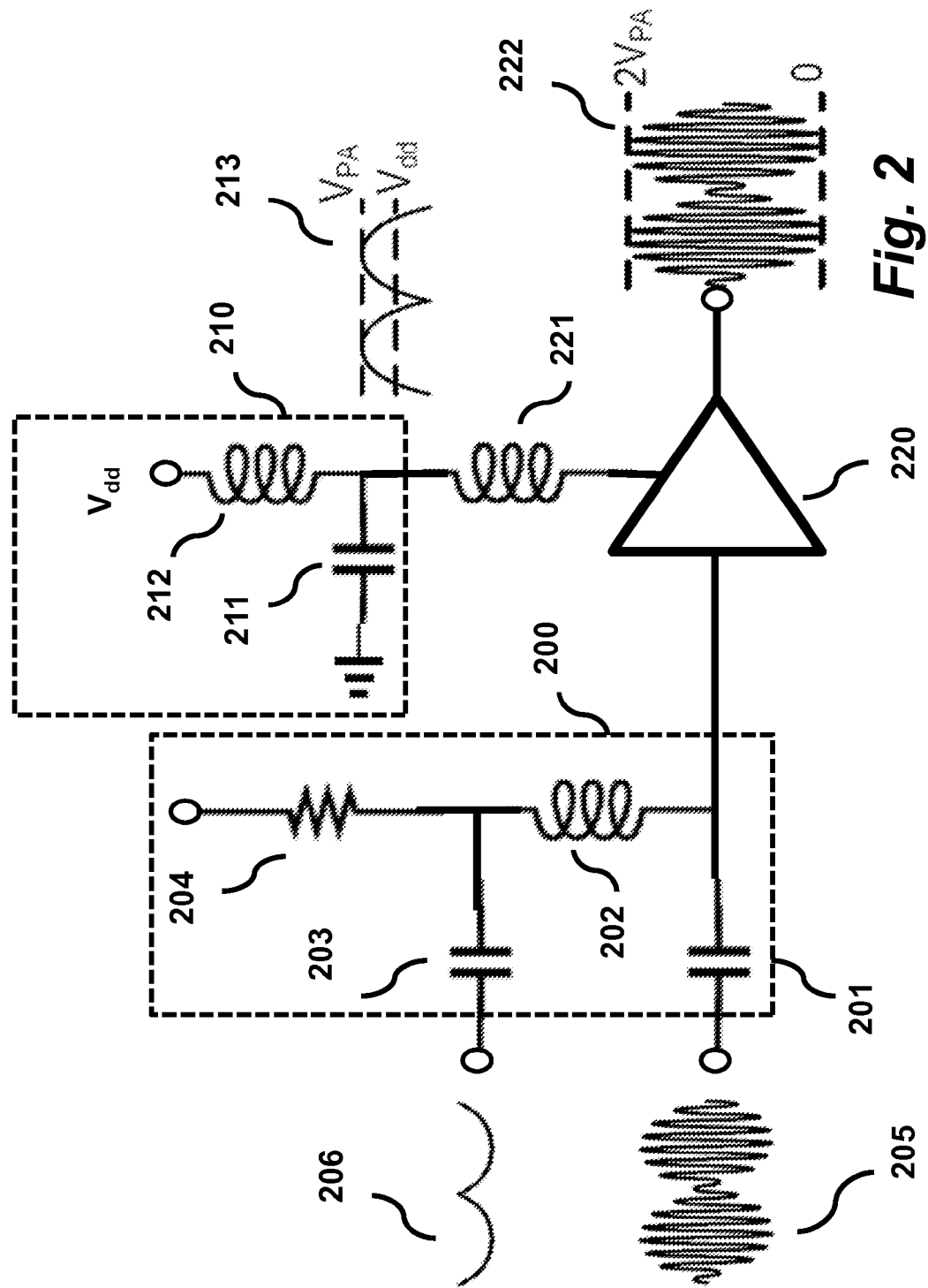
FIG. 2 is a schematic of a prior art self-envelope tracking PA.
Figure 3:
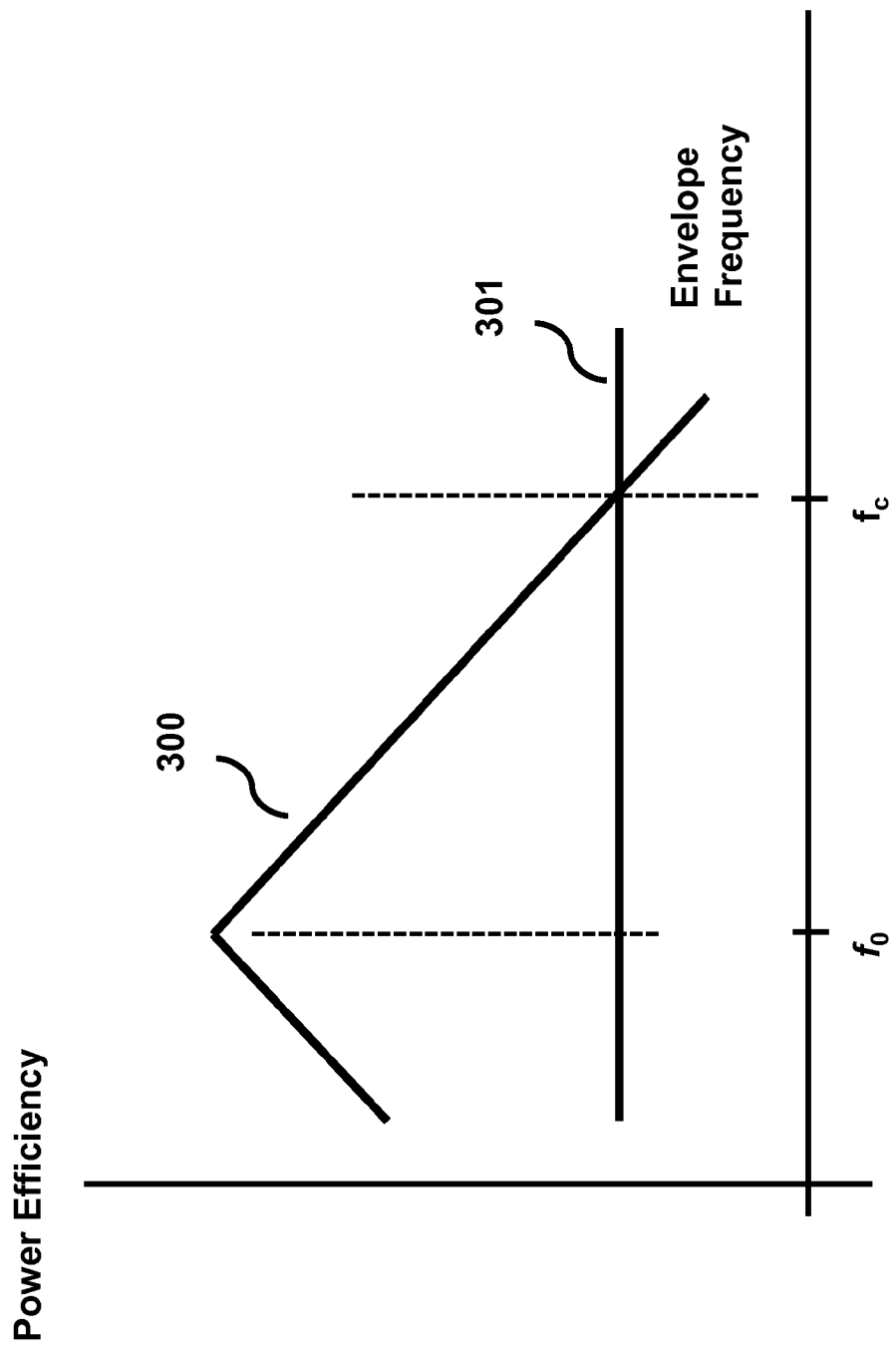
FIG. 3 is a graph of power efficiency as a function of frequency of a prior art self-envelope tracking PA.
Figure 4:
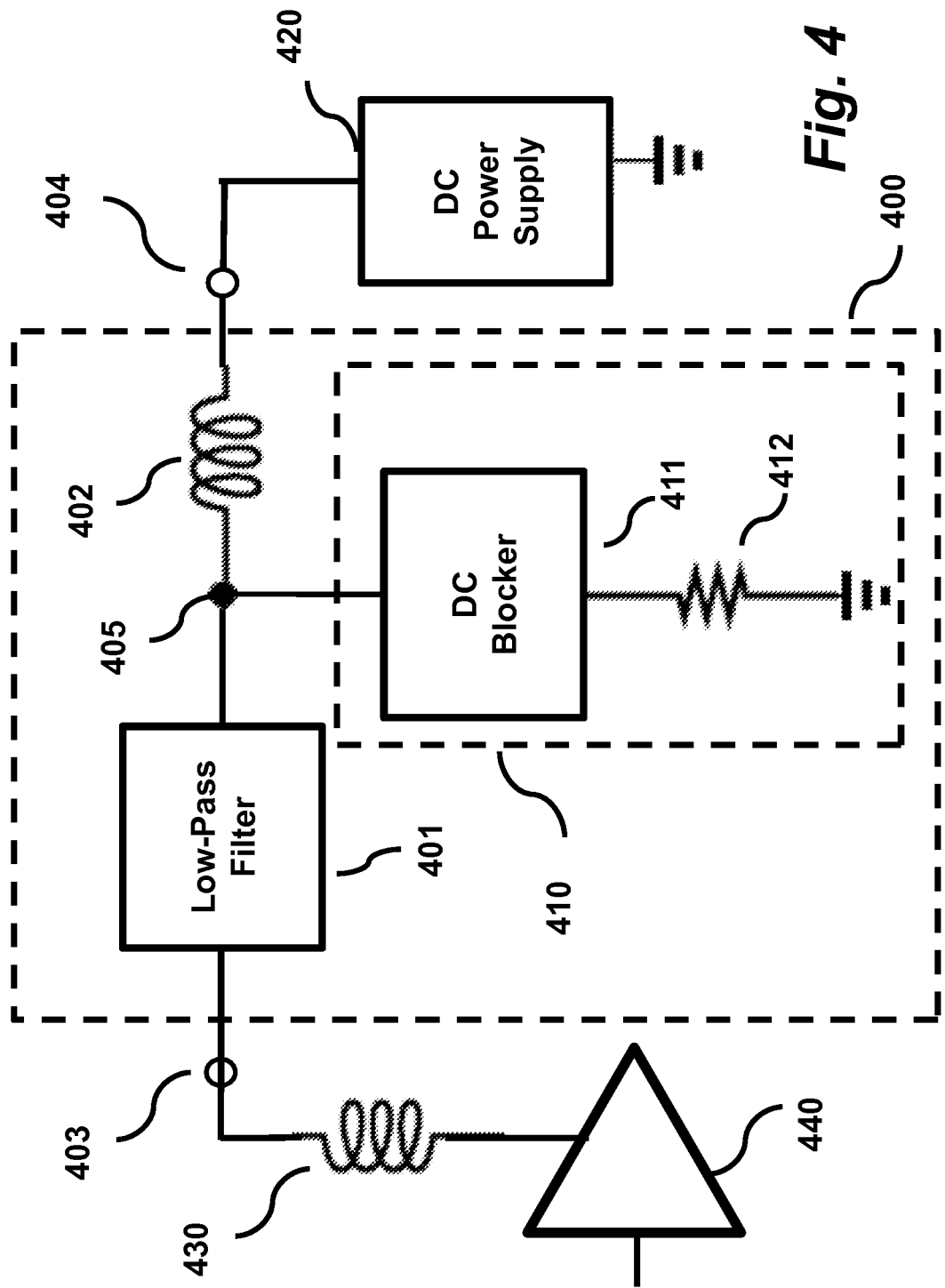
FIG. 4 is a schematic of a wideband envelope load network according to embodiments of the invention.

FIG. 4 shows the wideband envelope load network 400 of this invention, which includes a low-pass filter 401 with an output 405, AC-termination 410, and envelope choke inductor 402. An input terminal 403 of an envelope load network 400 is connected to an RF choke inductor 430, which provides high impedance to a main PA 440 at RF frequencies. An output terminal 404 of the envelope load network 400 is connected to a DC power supply 420, which has very low output impedance. Therefore, without an envelope choke inductor 402, the low-pass filter 401 is terminated by very low impedance, which in turn significantly distorts the pass band frequency response of the low pass filter 401. AC-termination 410 prevents this undesirable pass band frequency distortion caused by the low output impedance of a DC power supply 420. The DC blocker in the AC-termination 410 can be implemented by either a coupled transmission line or a capacitor. A resistor 412 provides necessary termination impedance to the filter 401. Because of a DC blocker 411, a resistor 412 does not dissipate DC energy, maintaining high PA power efficiency.

Figure 5:
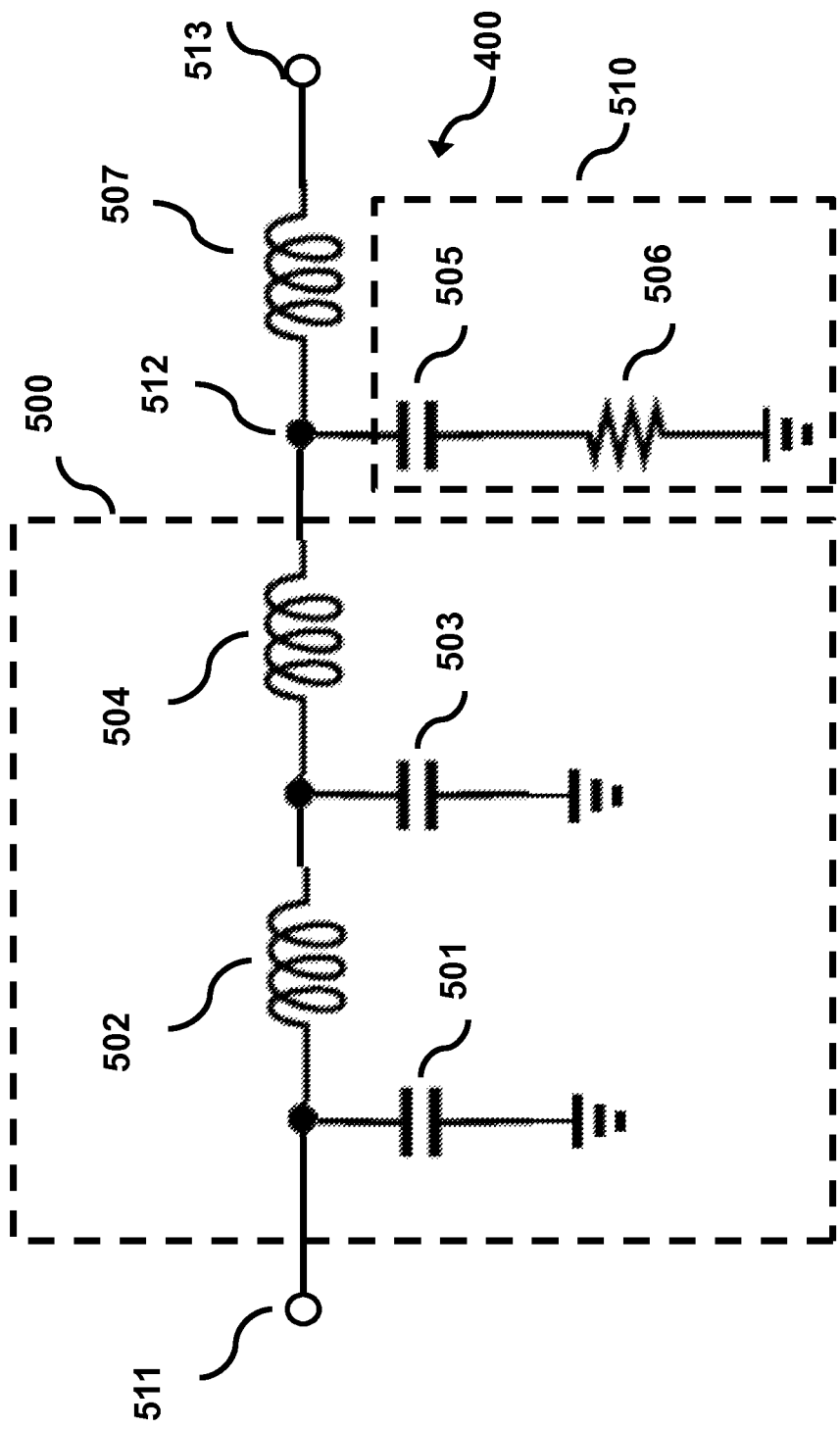
FIG. 5 is a schematic of an exemplar envelope load network according to some embodiments of the invention.

FIG. 5 shows an embodiment of the wideband envelope load network 400 of this invention. The low-pass filter 401 is realized as a LC low-pass filter 500, which includes inductors 502 and 504, and capacitors 501 and 503. The DC blocker in the AC-termination 510 is implemented with a capacitor 505 and resistor 506. The frequency response between the input terminal 511 and the filter output node 512 is flat until the cut-off frequency of the low-pass filter 500. Compared to the envelope load network used in the conventional self-envelope tracking PAs, which is based on a resonant LC tank, the advantage of this design is that a much wider envelope bandwidth can be provided. Wider envelope width in turn provides power-added efficiency (PAE) improvement for transmit signals that occupy a wider bandwidth channel. The envelope choke inductor 507 isolates the envelope load network from the very low output impedance of DC power supply that is connected at the node 513.

Figure 6A:
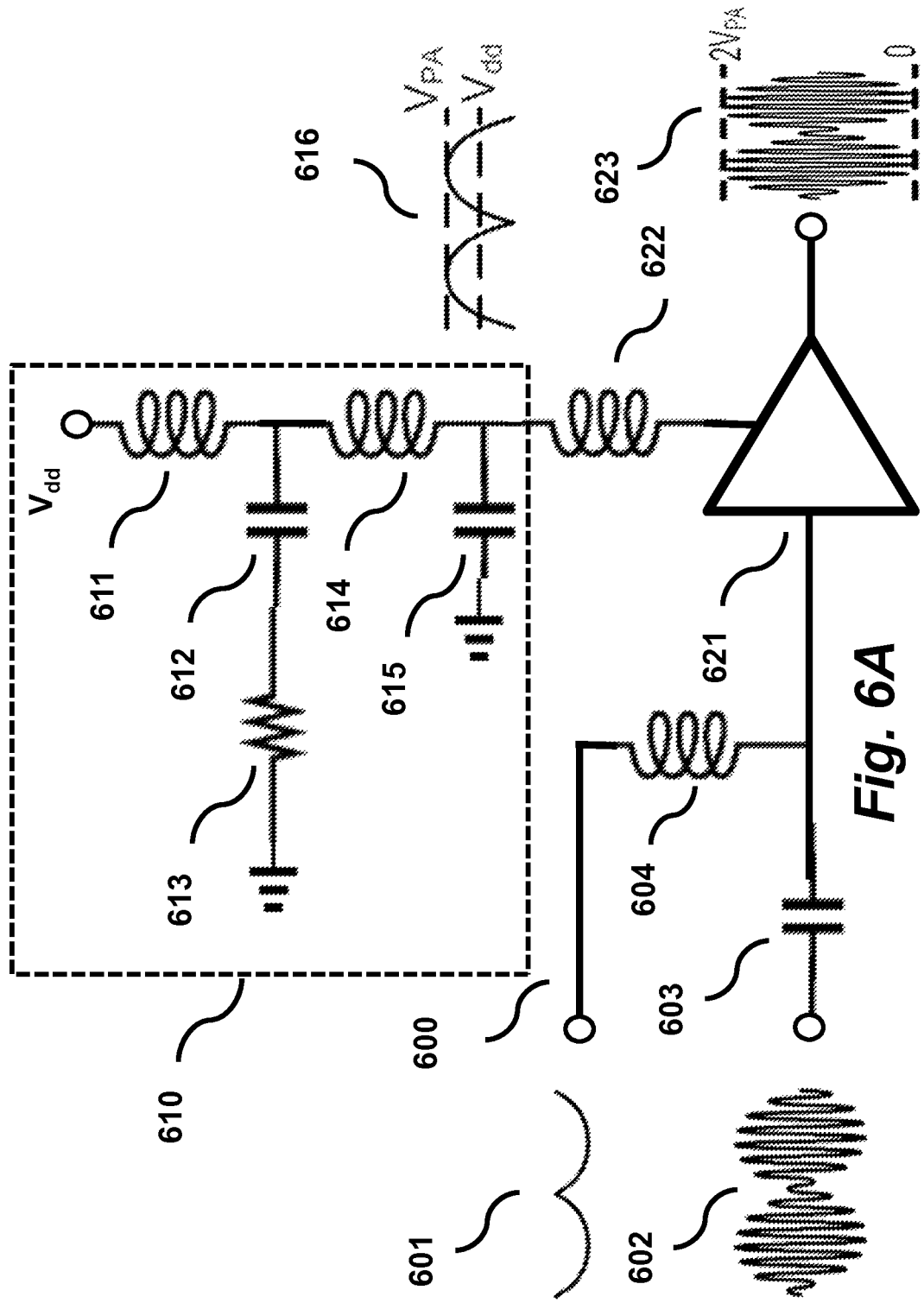
FIG. 6A: is a schematic of a wideband self-envelope tracking PA according to some embodiments of the invention.

FIG. 6A shows a wideband self-envelope tracking PA according to some embodiments, which is based on the envelope load network of the invention. The wideband self-envelope tracking PA includes of input network 600, envelope load network 610, main PA 621, and RF choke inductor 622. The RF input signal 602 is isolated from the DC bias point by the coupling capacitor 603. The DC bias point as well as the envelope amplitude of the RF input signal, which is given by a separate signal source 601, is applied through the inductor 604, which isolate the signal source 601 from the RF input signal 602. The envelope signal 601 modulates the PA supply voltage 616.

The envelope choke inductor 611 is connected to a DC power supply with an output voltage of $V_{dd}$. The envelope load network also includes capacitors 612 and 615, an inductor 614 and resistor 613. The envelope load network provides a PA supply voltage $V_{pa}$, which is higher than the DC power supply output voltage $V_{dd}$ because of resonance. Therefore, the main PA output 623 has an output swing of 2Vpa.

Figure 6B:
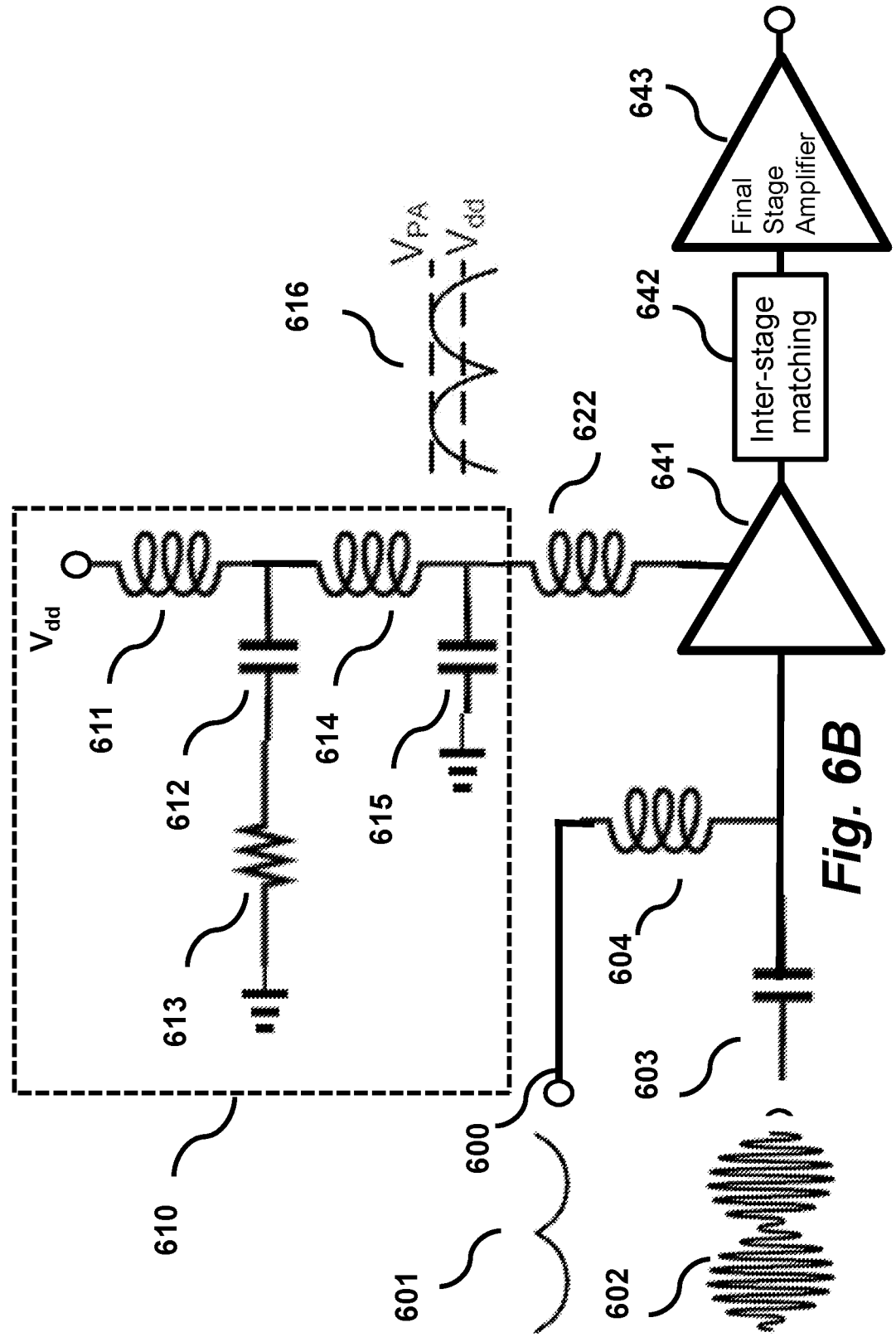
FIG. 6B is schematic of a wideband self-envelope tracking driver amplifier with inter-stage matching according to some embodiments of the invention.

FIG. 6B shows a wideband self-envelope tracking driver amplifier according to some embodiments, which is based on the envelope load network of the invention. The wideband self-envelope tracking driver amplifier includes of input network 600, envelope load network 610, and RF choke inductor 622. The RF input signal 602 is isolated from the DC bias point by the coupling capacitor 603. The DC bias point as well as the envelope amplitude of the RF input signal, which is given by a separate signal source 601, is applied through the inductor 604, which isolate the signal source 601 from the RF input signal 602. The envelope signal 601 modulates the driver amplifier supply voltage 616.

A driver amplifier 641 output is connected to the input of a final stage amplifier 643, through an inter-stage matching network 642, which is used to match the maximum power delivery conditions between driver and final stage amplifiers. In this configuration, a total line-up power efficiency of the driver amplifier stage is boosted, as described for the embodiment of FIG. 6A. Therefore, the whole RF line-up efficiency is be boosted including both driver and final amplifier stages, when the self-load network 610 are used for supplying the voltage for both amplifier stages.

Figure 7:
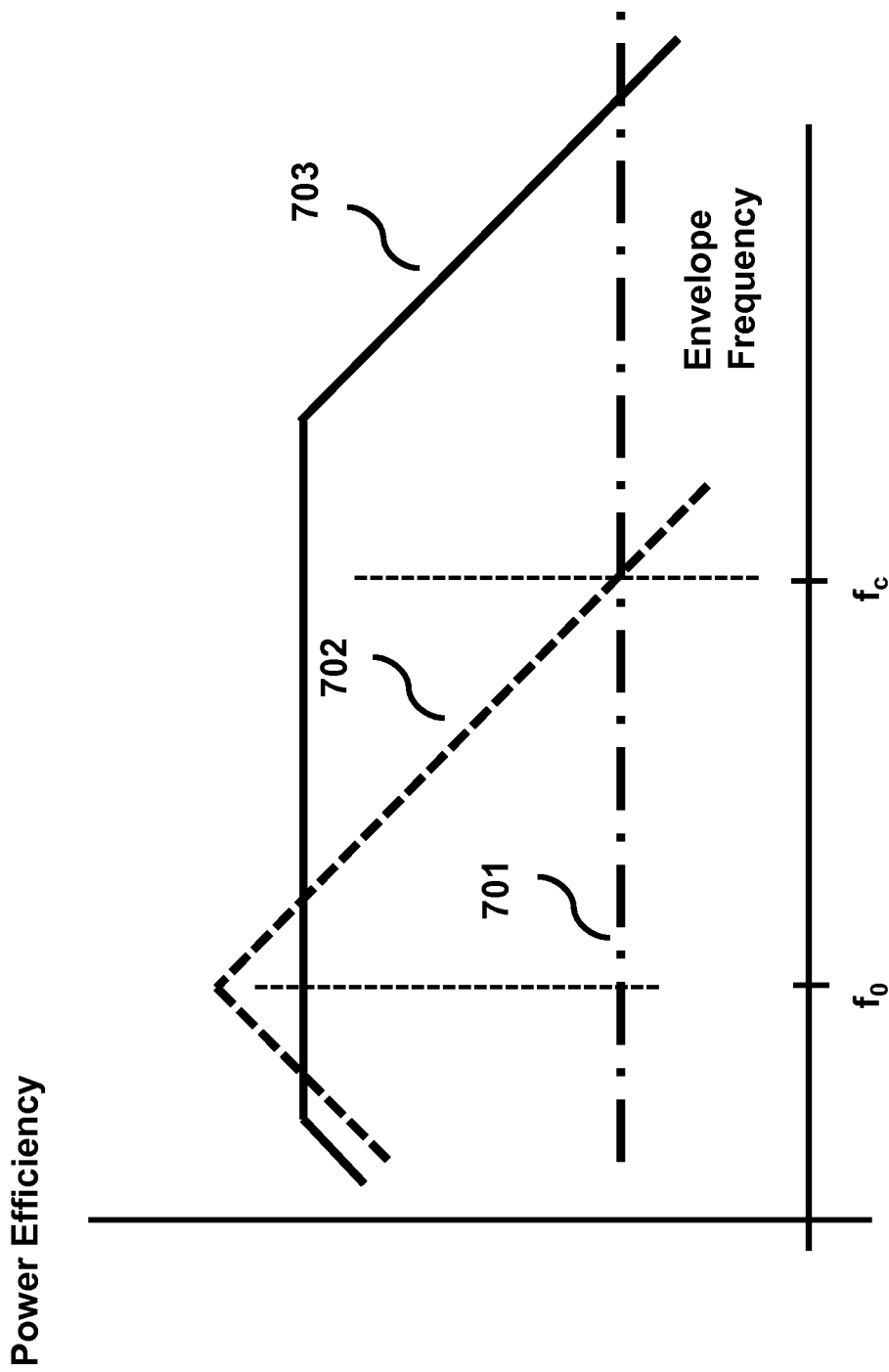
FIG. 7 is a graph of power efficiency as a function of envelope frequency of a wideband self-envelope tracking PA according to some embodiments of the invention of this invention.

FIG. 7 shows the power efficiency as a function of the envelope frequency of a wideband self-envelope tracking PA of this invention. The power efficiency curve 703 with this invention is high for a much wider bandwidth compared to the power efficiency curve 702 of conventional self-envelope tracking PAs. The power efficiency curve 701 is for the conventional PAs without envelope tracking techniques applies. The cross-over frequency where the power efficiency curve of a self-envelope tracking PA meets the power efficiency of the conventional PAs is denoted as fc. The cross-over frequency of a wideband self-envelope tracking PA of this invention can be designed to exceed the cross-over frequency of prior art self-envelope tracking PAs by as much as a factor of 10.

The peak efficiency of a conventional self-envelope tracking PA with a resonant envelope load network is typically higher than the peak efficiency of the wideband self-envelope tracking PA in this invention for two reasons. First, the wideband envelope load network, which is based on a multi-stage low-pass filter, has a lower Q factor than the resonant envelope load network. Second, the wideband envelope load network can include multiple inductors that are in series between the main PA and the main DC power supply. Because the parasitic series-resistance of these series-connected inductors is loaded with the drain current of the main PA, the power efficiency is degraded.

The advantage of the wideband self-envelope tracking PAs that the power efficiency improvement is achieved with transmit signals with wider bandwidth outweighs the higher peak power efficiency of conventional self-envelope tracking PAs.

Figure 8:
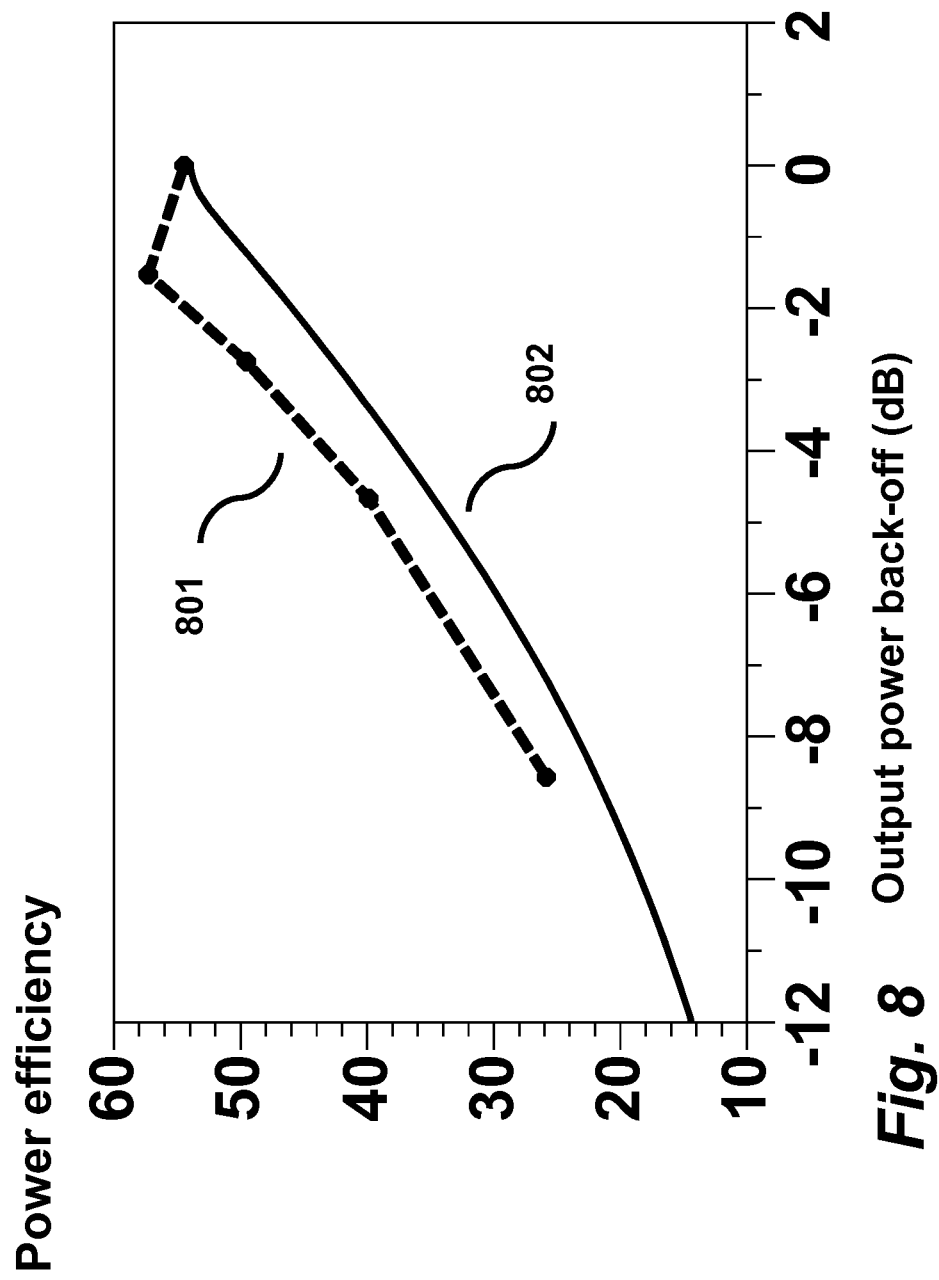
FIG. 8 is a graph of power efficiency as a function of output powers of a wideband self-envelope tracking PA according to some embodiments of the invention for a two-tone signal with 20-MHz spacing.

FIG. 8 shows the power efficiency versus output power back-off of a self-envelope tracking PA of this invention for a two-tone signal with 20-MHz spacing. The two-tone power efficiency curve 801 of the wideband self-envelope tracking PA of this invention is compared with the two-tone power efficiency curve 802 of a conventional PA without envelope tracking techniques. Depending on the output power back-off, 5-10% power efficiency improvement can be achieved for the output power back-off less than 10 dB. With prior art conventional self-envelope tracking PAs, the power efficiency for the two-tone signals with 20-MHz spacing will be lower than the power efficiency curve 802 due to the limited bandwidth of the self-envelope tracking load network.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A wideband radio frequency (RF) power amplifier (PA) comprising:
 a main PA having a first input terminal and a second input terminal; and
 a wideband envelope load network having a network output terminal and a network input terminal connected to the second input terminal of the main PA via an RF choke inductor, wherein the wideband envelope load network comprises:
 a low-pass filter connected to the network input terminal;
 an envelope choke inductor connected to the network output terminal; and
 a DC blocker connected between an output terminal of the low-pass filter and an input terminal of the envelope choke inductor, and ground by a termination resistor, wherein the network output terminal is connected to the output terminal of the low-pass filter via the envelope choke inductor and to a direct current (DC) power supply, and wherein the low-pass filter is connected between the network input terminal and the DC blocker.

2. The wideband RF PA of claim 1, further comprising:
 a final stage amplifier connected to the main PA by an inter-stage matching network to boost a total line-up power efficiency.

3. The wideband RF PA of claim 1, further comprising:
 an input network having a separate signal isolation inductor, wherein a separate signal is applied to the main PA via the separate signal isolation inductor.

4. The wideband RF PA of claim 3, wherein the separate signal includes a DC bias point and an envelope amplitude of an RF input signal.

5. The wideband RF PA of claimed 1, wherein the DC blocker includes a capacitor connected to the output terminal of the low-pass filter and a resistor connected to the capacitor, wherein the resistor is grounded.

6. The wideband RF PA of claim 2, wherein the network input terminal is connected to the main PA via the RF choke inductor, and the main PA is connected to the inter-stage matching network.

* * * * *